United States Patent
Lin et al.

(10) Patent No.: US 8,395,950 B2
(45) Date of Patent: Mar. 12, 2013

(54) MEMORY DEVICE HAVING A CLOCK SKEW GENERATOR

(75) Inventors: Tzu-Kuei Lin, Chu-Pai (TW); Hung-Jen Liao, Hsin-Chu (TW); Shao-Yu Chou, Chu Pei (TW); Ching-Wei Wu, Caotun (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 146 days.

(21) Appl. No.: 12/968,582

(22) Filed: Dec. 15, 2010

(65) Prior Publication Data

US 2012/0092944 A1    Apr. 19, 2012

Related U.S. Application Data

(60) Provisional application No. 61/393,444, filed on Oct. 15, 2010.

(51) Int. Cl.
    *G11C 7/00* (2006.01)
(52) U.S. Cl. ..................... 365/194; 365/233.5
(58) Field of Classification Search ........... 365/194, 365/233.5
    See application file for complete search history.

(56) References Cited

U.S. PATENT DOCUMENTS

| | | | | |
|---|---|---|---|---|
| 6,671,842 | B1 * | 12/2003 | Phan et al. | ..................... 714/733 |
| 7,518,841 | B2 | 4/2009 | Chuang et al. | |
| 2007/0223157 | A1 | 9/2007 | Chen et al. | |
| 2011/0207409 | A1 | 8/2011 | Ker et al. | |

OTHER PUBLICATIONS

Shiu, Y.D. et al., "CMOS power amplifier with ESD protection design merged in matching network", Proc. IEEE 14th International Conference on Electronics, Circuits and Systems, Dec. 2007, pp. 825-828.

Thijs, S. et al, "CDM and HBM analysis of ESD protected 60 GHz power amplifier in 45 nm low-power digital CMOS", Proc. EOS/ESD Symposium, Sep. 2009, pp. 1-5.

* cited by examiner

*Primary Examiner* — Michael Tran
(74) *Attorney, Agent, or Firm* — Duane Morris LLP (57) ABSTRACT

A memory device is provided with memory components and a clock skew generator, supporting at least two read and write operations that can occur coincidentally in read-read, read-write and write-write modes of operation of the memory device. The clock skew generator produces at least two stable and balanced clock channels carrying the at least two clock signals and varies relative timing of the clock signal edges so as to displace the edges in time, in those modes of operation wherein simultaneous edges would lead to detrimental loading.

17 Claims, 8 Drawing Sheets

CLK Skew control table

| | TM RWM | TM ALD | TM BLD | WEBA | WEBB | Result | Remarks |
|---|---|---|---|---|---|---|---|
| Normal | 0 | 0 | 0 | X | X | No Skew | normal rd wt |
| RR | 1 | 0 | 0 | 1 | 1 | Same CLK | worst read |
| WaRb | 1 | 0 | 1 | 0 | 1 | CLKB skew | worst write |
| WbRa | 1 | 1 | 0 | 1 | 0 | CLKA skew | worst write |
| WaWb | 1 | 0 | 1 | 0 | 0 | CLKB skew | tcc check |
| WbWa | 1 | 1 | 0 | 0 | 0 | CLKA skew | tcc check |

MEMORY DEVICE HAVING A CLOCK SKEW GENERATOR

CROSS REFERENCE TO RELATED APPLICATIONS

This application claims the benefit of U.S. provisional application entitled, "MEMORY DEVICE HAVING A CLOCK SKEW GENERATOR," having Ser. No. 61/393,444, filed on Oct. 15, 2010, all of which are entirely incorporated herein by reference.

BACKGROUND

In dual-port static random access memories (SRAM), there are typically "read-disturb-write" and "write-disturb-write" phenomenon that can implicate the minimum input voltage, $V_{CCmin}$. A "read-disturb-write" situation can arise, for example, when at one port (e.g., an "A-port") a write operation occurs and at another port (e.g., a B-port) a dummy read operation occurs simultaneously. Assuming that the write/read addresses designate the same row but different columns, the result can be that: (1) the designated-bit is written by the A-port, and the dummy read by B-port; (2) the B-port BL is precharged at the $V_{DD}$ level, so the dummy read typically disturbs the voltage level of the A-port, which affects its write operation; and (3) the "write-bit" $V_{CCmin}$ is degraded, which can be determined through test results.

BRIEF DESCRIPTION OF THE DRAWINGS

The accompanying drawings illustrate preferred embodiments of the invention, as well as other information pertinent to the disclosure, in which.

DETAILED DESCRIPTION

Exemplary memory devices are first discussed with reference to the figures. Although these memory devices are described in detail, they are provided for purposes of illustration only and various modifications are feasible. After the exemplary memory devices are described, examples of flow diagrams of the memory devices are provided to explain the manner in which stable and balanced clock channels associated with the at least two clock signals are generated in a memory device according to certain advantageous examples.

Figure 1:
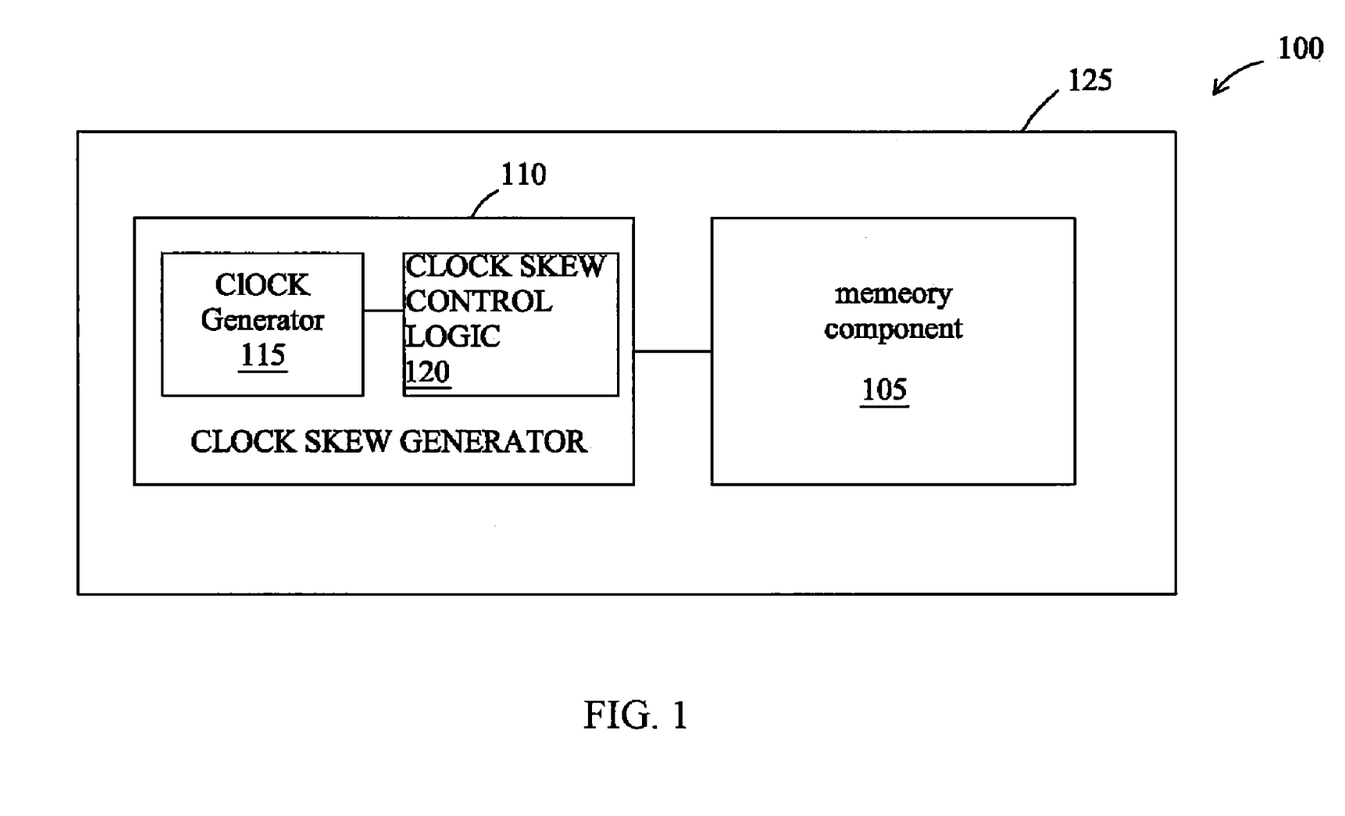
FIG. 1 is a general block diagram that illustrates an embodiment of a memory device having a clock skew generator.

FIG. 1 is a general block diagram that illustrates an embodiment of a memory device 100 having a clock skew generator 110. The memory device 100 can be, but is not limited to, a dual port static random access memory (SRAM) or any other types of memory chip. The memory device 100 includes a housing 125, memory components 105, and a clock skew generator 110. The housing 125 can be defined as a package for the memory device 100. The memory components 105 are contained in the housing 125 and support at least two substantially coincident operations of the memory device that comprise one of read operations and write operations. The clock skew generator 110 is contained in the housing 125 and sends at least two clock signals to the memory components 105. The clock skew generator 110 generates at least two stable and balanced clock channels associated with the at least two clock signals for timing the operations of the memory device. The clock skew generator 110 includes a clock generator 115 that generates clock signals and a clock skew control logic 120 that stabilizes and balances the clock channels. The clock skew control logic 120 is further described in connection with FIGS. 2-8.

Figure 2:
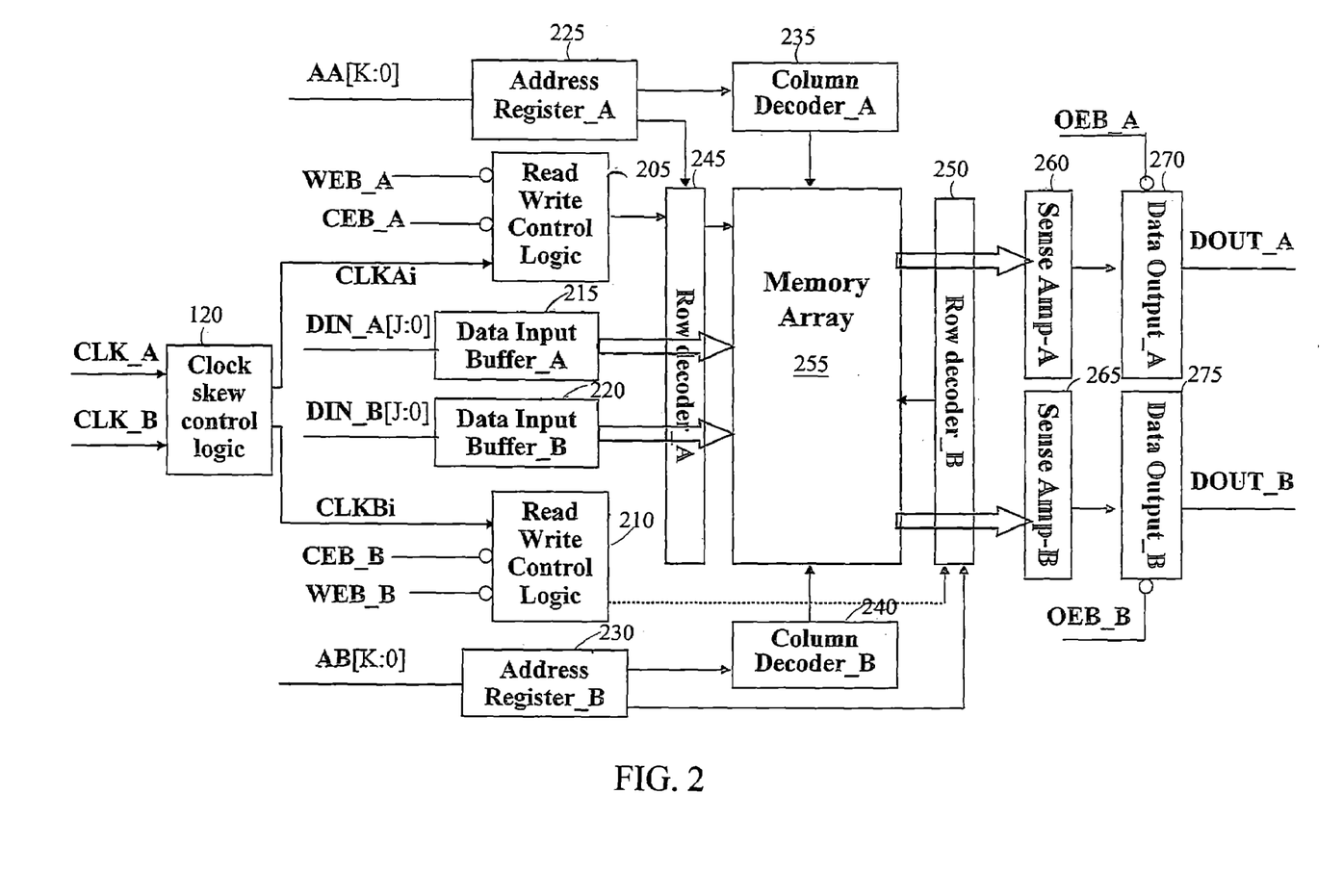
FIG. 2 is a high-level block diagram that illustrates an embodiment of a memory device, such as that shown in FIG. 1, having a clock skew control logic.

FIG. 2 is a high-level block diagram that illustrates an embodiment of a memory device 100, such as that shown in FIG. 1, having a clock skew control logic element 120. Clock signal A (CLK_A) and clock signal B (CLK_B) are generated by the clock generator 115 and sent to the clock skew control logic 120, which processes CLK_A and CLK_B into clock signal Ai (CLKAi) and clock signal Bi (CLKBi).

Generally the memory device 100 supports three operations: read, write and standby, which are achieved by utilizing read-write control logic elements 205, 210, buffers 215, 220, address registers 225, 230, decoders 235, 240, 245, 250, memory array 255, sense amplifiers 260, 265, and data output controllers 270, 275. Plural operations can occur substantially coincidentally in different combinations defining different modes of operation of the memory device 100. Using the clock signals A and B (CLK_A and CLK_B), chip enable signals (CEB_A and CEB_B), write signals (WEB_A and WEB_B), and output enable signals (OEB_A and OEB_B), in addition to a set of address bits, the arrays 255 are able to either read or write a digital data word anywhere in its addressable space. Memory access can be synchronous and can be triggered by the rising edge of the clock signals. Input address, input data, write enable, output enable and chip enable can be latched by the rising edge of the clock signals. Such clock signals are generally either used for pre-charging the bit lines or enabling a read or write operation, or both. During the first half of the clock cycle the bit lines can be pre-charging high, and during the second half a read or write operation can be taking place.

A write cycle is initiated in the memory device 100 if the write enable signal (WEB), and the chip enable signals (CEB_A and CEB_B) are asserted at the rising-edge of the clock signals. Input data (DIN_A and DIN_B) is written to the memory cells or spaces of the memory array 255. Similarly, a read cycle is initiated if the chip enable signals and the output enable signals (OEB_A and OEB_B) are asserted and the write enable signal is low at the rising-edge of the clock signals. The contents of the memory device location that is specified by the addresses applied to the memory array 255 are driven on the data output buses (DOUT_A and DOUT_B). A standby mode can be provided to reduce power dissipation during periods of non-operation (e.g., while CEB=1).

Figure 3:
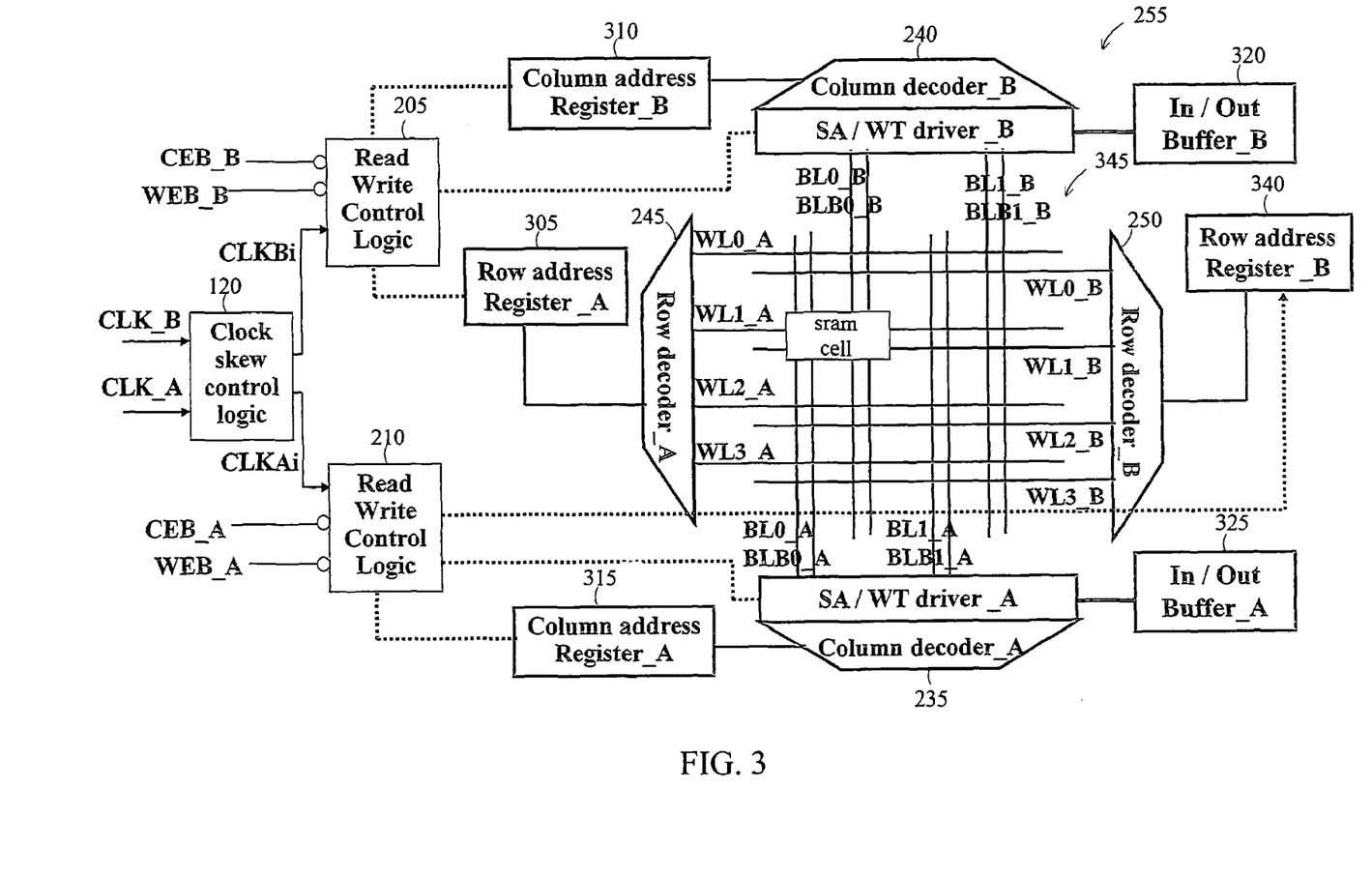
FIG. 3 is a more detailed block diagram that illustrates an embodiment of a memory device, such as that shown in FIG. 2.

FIG. 3 is a somewhat more-detailed block diagram that illustrates an embodiment of a memory device 100, such as that shown in FIG. 2, particularly with respect to the details of the memory array 255. Like features are labeled with the same reference numbers, such as the clock skew control logic 120, read-write control logics 205, 210, and decoders 235, 240, 245, 250. However, the address register A 225 (FIG. 2) is shown to be implemented with a row address register A 305, and a column address register A 315, and address register B 230 (FIG. 2) is implemented with a row address register B 340, and a column address register B 310, as shown in FIG. 3. Also, FIG. 3 further illustrates that the memory array 255 includes drivers 330, 335 that are coupled to buffers 320, 325, respectively.

Memory cells 345 that store one bit of information are arranged in a two-dimensional array. Each memory cell 345 has a word line (e.g., WL0_A, WL0_B, WL1_A, WL2_A, WL2_B, WL3_A, WL3_B) that acts to control the cell 345. The signal that accesses the cell 345 to either read or write data is applied to the word line. Lines that are perpendicular to the word line are bit lines (e.g., BL0_A, BL0_B, BLB0_A, BLB0_B, BL1_A, BL1_B, BLB1_A, BLB1_B). The data that is being written into or read from the memory array 255 are found on the bit lines.

Row decoders 245, 250 have, for example, two (2) input addresses and the selection of one word line. Each cell 345 on that word line is connected to a specific bit line that can either access and read out data stored in the cell 345 or write new data into the cell 345. The drivers 330, 335 are generally located at the bottom of each bit line. Column decoders 235, 240 are generally located below the drivers 330, 335 and decide which bit line to connect to the chip output.

A read operation generally begins with a row address being input to the row decoder 245, 250. After buffering the address, the row decoder 245, 250 gates a signal to a selected output line that determines which word line is to be activated. All of the cells 345 connected to that word line selectively produce a small voltage (about 100 mV), applied to their respective bit lines to represent a stored 0 or 1. The drivers 330, 335 amplify the bit line voltage to a full logic level difference for a respective 0 or 1 value. The data from the cells 345, which are on the selected word line, is buffered and output to the output buffer 320, 325. Here the data can be stored in a shift register (not shown). The data can be shifted out from the memory chip under the control of a system clock (not shown), for example at a predetermined phase of the system clock cycle.

A write operation also begins with a row address being generated, as in a read operation. After that, the new data is input to an input buffer (not shown). Under the control of the system clock, the data can pass through the drivers 330, 335 and the column decoder 235, 240. The data is applied to the cells 345 that are on the previously selected word line. The old data is replaced by the new data, e.g., the memory cells are set or reset according to the value of the input data that is applied.

Figure 4:
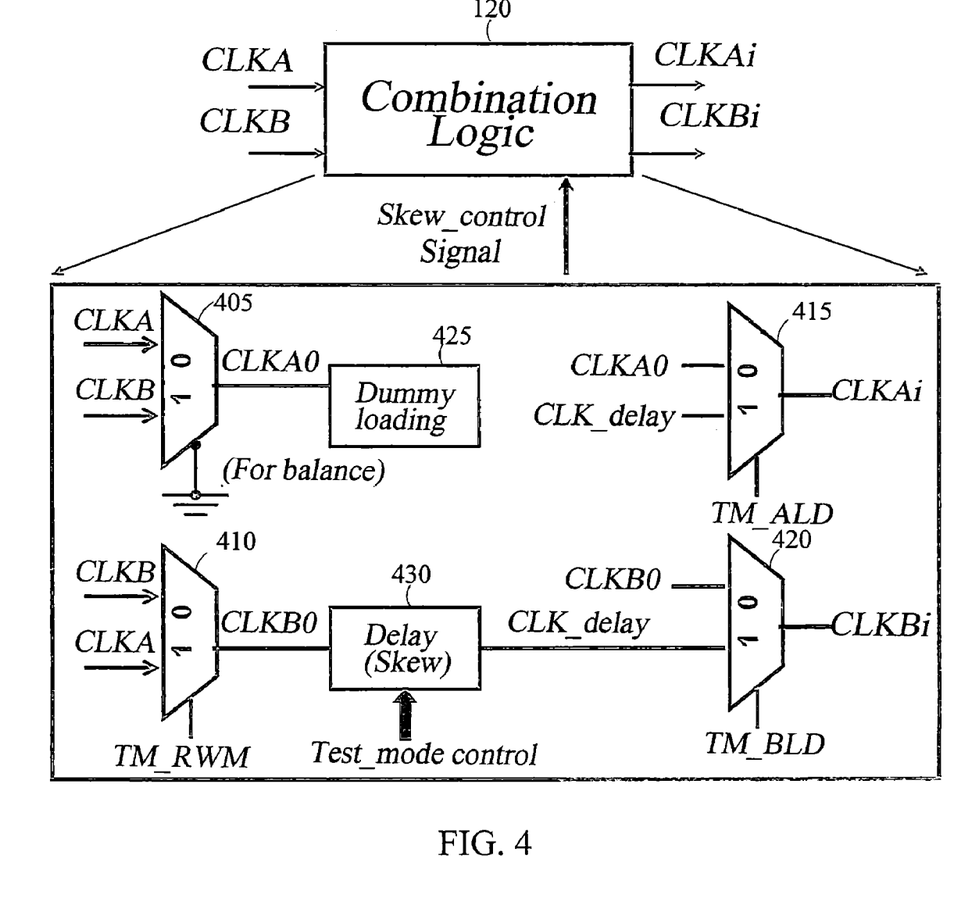
FIG. 4 is a more detailed block diagram that illustrates an embodiment of clock skew control logic, such as that shown in FIG. 3.

FIG. 4 is a more detailed block diagram that illustrates an embodiment of a clock skew control logic element 120, such as that shown in FIG. 3. The clock skew control logic 120 can comprise combination logic that includes multiplexers 405, 410, 415, 420, a dummy loading device 425, and a delay device 430. The clock signals CLKA, CLKB are input into multiplexers 405, 410, which process and generate signals CLKA0, CLKB0, respectively. In general, the combination logic 120 is designed to be responsive to different read/write states of the memory device to vary the timing of the at least two clock signals and/or to generate substantially coincidental clock signals in a read-read mode of the memory components. The signal CLKA0 is sent to the dummy loading device 425, which stores the signal CLKA0 to be input into multiplexer 415.

The multiplexer 410 processes the signal CLKB0 based on the signal TM_RWM. The signal CLKB0 is sent to the delay device 430, which delays the signal CLKB0 to generate signal CLK_delay based on the test mode control signal. The multiplexers 415, 420 both receive the signal CLK_delay and receive signals CLKA0, CLKB0, respectively. The multiplexers 415, 420 process and generate signals CLKAi, CLKBi based on signals TM_ALD, TM_BLD, respectively.

Figure 5:
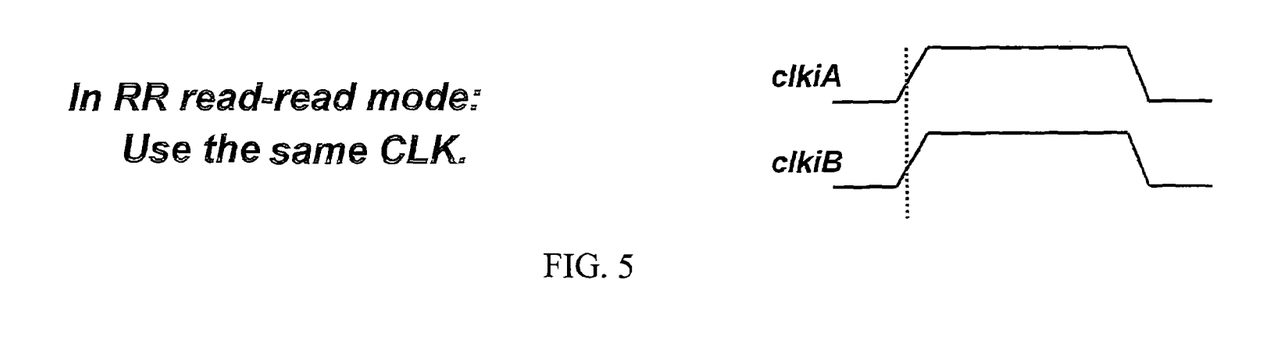
FIGS. 5-7 illustrate embodiments of output waveforms from a clock skew control logic, such as that shown in FIG. 3, in a read-read mode, write-read mode, and write-write mode, respectively.
Figure 6:
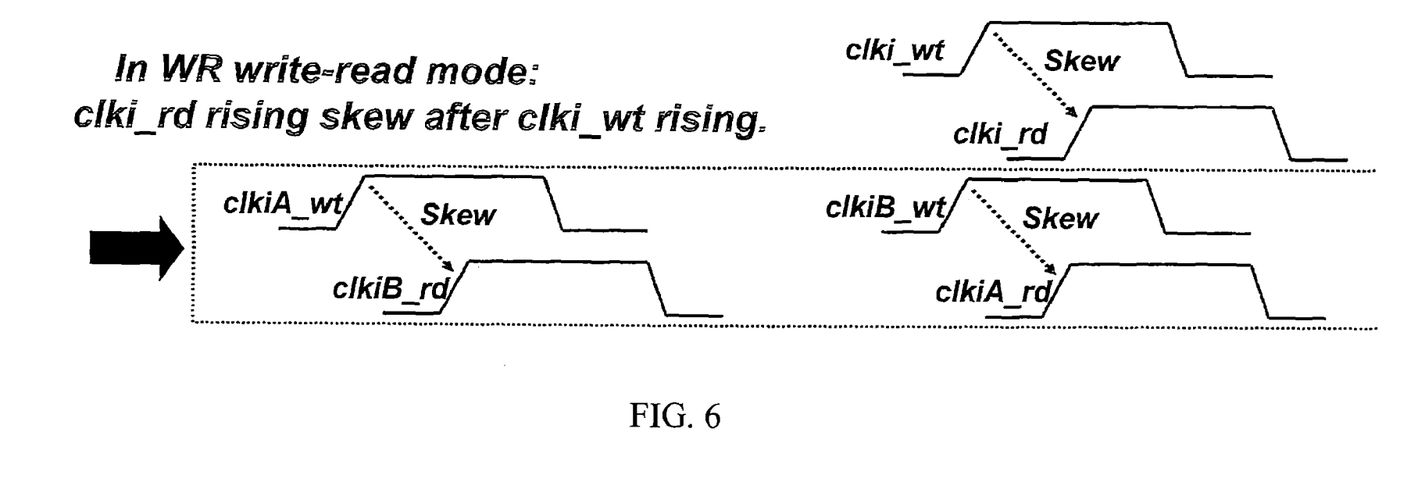
Figure 7:
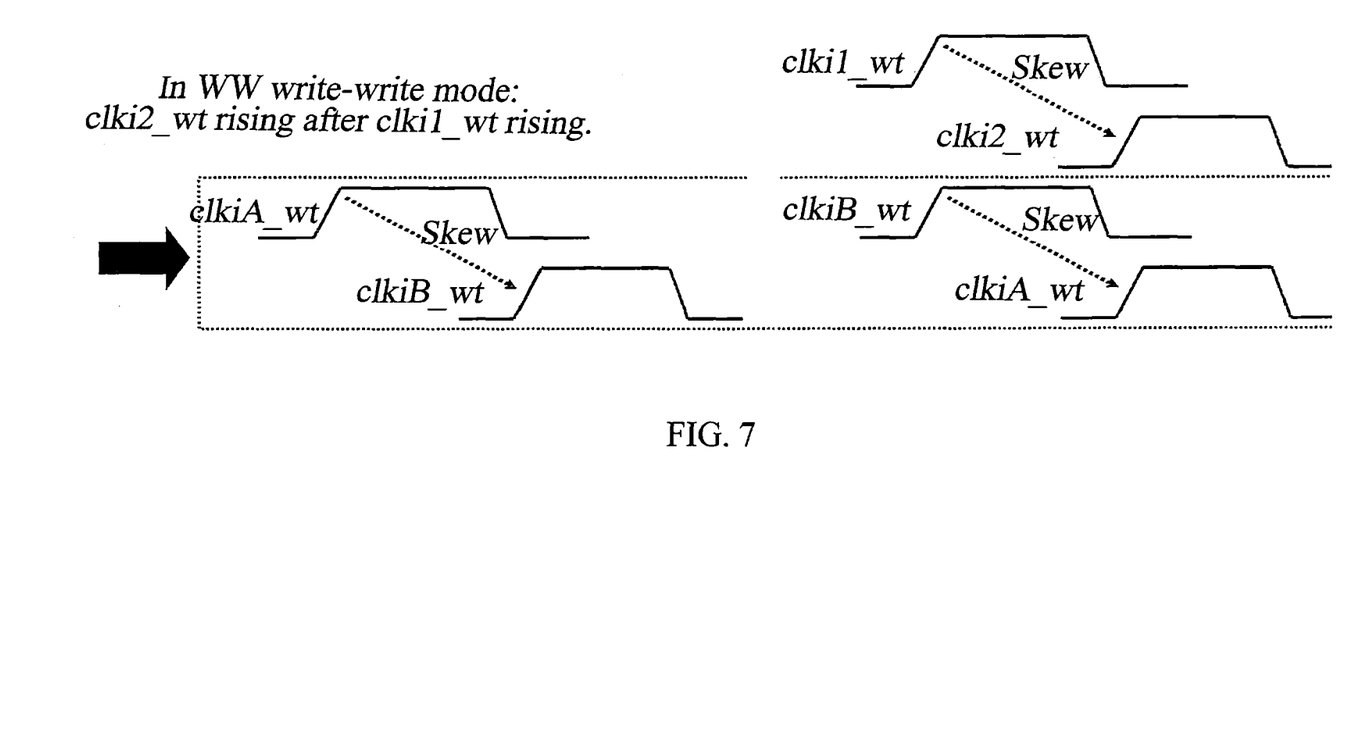

The process of determining the results of the signals CLKAi, CLKBi are further described in connection with FIGS. 5-8. FIGS. 5-7 illustrate embodiments of output waveforms from a clock skew control logic 120, such as that shown in FIG. 3, in a read-read mode, write-read mode, and write-write mode, respectively. In FIG. 5, the combination logic 120 generates a clock signal clkiA and a clock signal clkiB that are substantially coincident (e.g., same phase and waveform) in a read-read mode.

In FIG. 6, the output of the combination logic 120 generates a rising edge or level of a write clock signal clki_wt between rising and declining edges of a read clock signal clki_rd in a write-read mode. In particular, if clock signals CLKA, CLKB (FIG. 4) are associated for write and read operations, respectively, then the combination logic 120 generates a rising edge in write clock signal clkiA_wt between rising and declining edges of a read clock signal clkiB_rd. If clock signals CLKA, CLKB (FIG. 4) are associated for read and write operations, respectively, then the combination logic 120 generates a rising edge of write clock signal clkiB_wt between rising and declining edges of a read clock signal clkiA_rd. It should be appreciated that in the context of this description, a rising or falling "edge" actually is a ramp with a finite dv/dt. There is a short time between the level changing between its high and low levels or between its current level and the level at which a switch or latch responsive to the level may be activated.

In FIG. 7, the combination logic 120 generates a rising edge in a first write clock signal clk1_wt after rising and declining edges of a second write clock signal clk2_wt in a write-write mode. In particular, the combination logic 120 can generate a rising edge a write clock signal clkiA_wt after rising and declining edges of a write clock signal clkiB_st. The combination logic 120 likewise can generate a rising edge of a write clock signal clkiB_wt after rising and declining edges of a write clock signal clkiA_wt.

Figure 8:
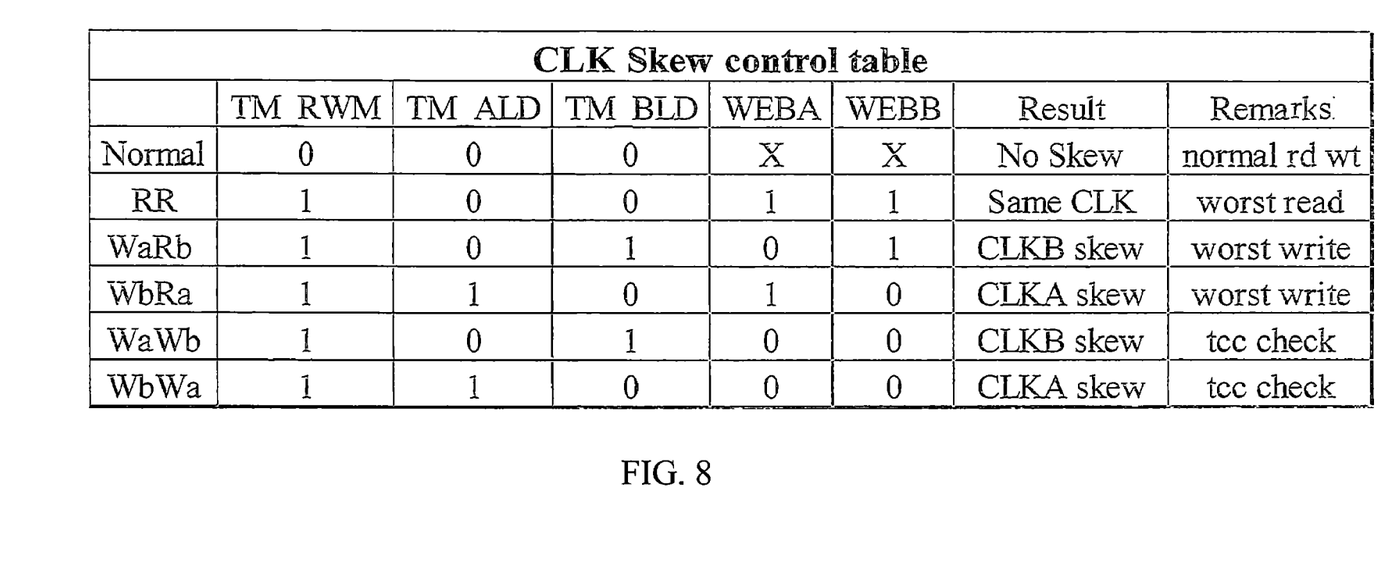
FIG. 8 is a table that depicts a clock skew control table generated by a clock skew control logic, such as that shown in FIG. 3.

FIG. 8 depicts a clock skew control table as generated by clock skew control logic 120, such as the example shown in FIG. 3. In normal mode, the signals TM_RWM, TM_ALD, TM_BLD are 0's and the write signals WEBA, WEBB can either be 1 or 0, resulting in no skew with normal read and write operations. In a read-read mode, the signal TM_RWM is 1, signals TM_ALD, TM_BLD are 0's and the write signals WEBA, WEBB are 1's resulting in substantially the same signal (e.g., same phase and waveform in the signal "CLKAi" and "CLKBi") with a "double read" operation that is worse than the "single read" operation.

In a write-read mode where the clock signals CLKA, CLKB (FIG. 4) are associated for write and read, the signals TM_RWM, TM_BLD are 1's, signal TM_ALD is 0 and the write signals WEBA, WEBB are 0 and 1, respectively, resulting in the clock signal CLKB being skew with a "read-disturb-write" operation that is worse than the "single write" operation. Because one port is read and another port is write in the same bitcell SRAM, the result can be a "read disturb write" situation. If the clock signals CLKA, CLKB (FIG. 4) are associated for read and write, respectively, the signals TM_RWM, TM_ALD are 1's, signal TM_BLD is 0 and the write signals WEBA, WEBB are 1 and 0, respectively, resulting in the clock signal CLKA being skew with a "read-disturb-write" operation that is worse than the "single write" operation.

In a write-write mode, the signals TM_RWM, TM_BLD are 1's signal TM_ALD is 0 and the write signals WEBA, WEBB are 0's, resulting in the clock signal CLKB being skewed with a checked "write-write" clock collision time. This means that a second write operation data can be replaced with the first write data while two clocks timing difference is larger than Tcc "clock collision time". If two clocks timing difference is smaller than Tcc, the second write operation data cannot be replaced with the first write data and result in an un-known data. If the signals TM_RWM, TM_ALD are 1's signal TM_BLD is 0 and the write signals WEBA, WEBB are 0's, resulting in the clock signal CLKA being skewed with a checked "write-write" clock collision time.

Figure 9:
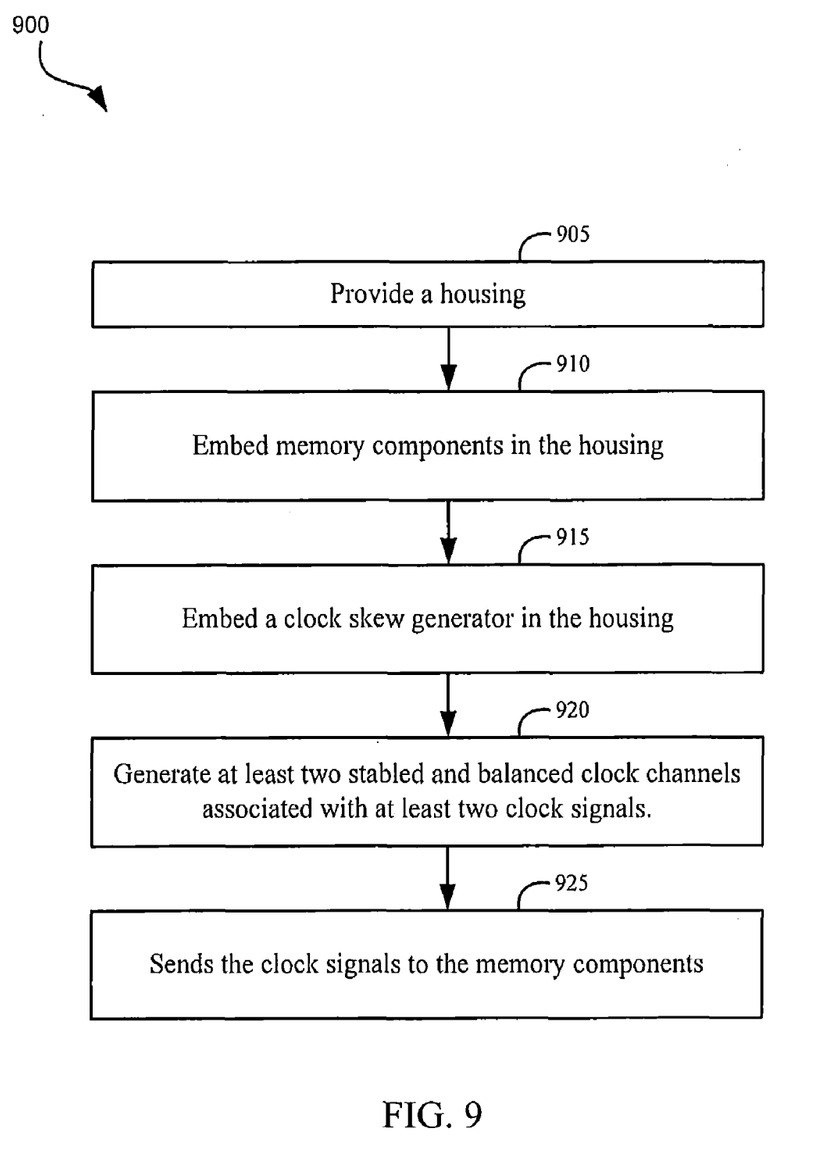
FIG. 9 is a flow diagram that illustrates a method for making and using a memory device, such as that shown in FIG. 1.

FIG. 9 is a flow diagram that illustrates a method for making and using a memory device 100, such as that shown in FIG. 1. Beginning with blocks 905, 910, a housing 125 is provided and memory components 105 are carried in the package or housing 125. In blocks 915 and 920, a clock skew generator 110 is contained in the housing 125 and generates at least two stable and balanced clock channels associated with at least two clock signals. The clock signals can be delayed and/or dummy loaded. In block 925, the clock skew generator 110 sends the clock signals to the memory components 105.

As described herein, an improved memory device 100 is presented utilizing a clock skew generator 110 that is embedded in the housing 125 of the memory device 100. The clock skew generator 110 generates at least two stable and balanced clock channels associated with the at least two clock signals. To achieve this, the clock skew generator 110 can delay or dummy load the clock signals where advantageous to prevent a conflict as described. The clock skew generator 110 can generate a first clock signal and a second clock signal that are substantially the same in a read-read mode, generate a rising edge of the second clock signal between rising and declining edges of the first clock signal in a write-read mode, and generate the rising edge of the second clock signal after the rising and declining edges of the first clock signal in a write-write mode.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A memory device comprising:
   memory components contained in a housing, wherein the memory components support at least two substantially coincident operations of the memory device that comprise one of read operations and write operations; and
   a clock skew generator including a clock skew control logic element contained in the housing and coupled to the memory components, wherein the clock skew control logic element is configured to at least one of delay and dummy load at least two clock signals that are to be applied to the memory components, and wherein the clock skew generator generates at least two stable and balanced clock channels associated with the at least two clock signals for timing the operations of the memory device.

2. The memory device of claim 1, further comprising a clock generator.

3. The memory device of claim 2, wherein the clock skew control logic element is designed to be responsive to different read/write states of the memory device to vary timing of the at least two clock signals.

4. The memory device of claim 1, wherein the clock skew control logic element produces delayed or dummy loaded signals that are coupled to operate the memory components for at least one of reading and writing operations.

5. The memory device of claim 3, wherein the clock skew control logic element generates a first clock signal and a second clock signal that are substantially coincident in a read-read mode of the memory components.

6. The memory device of claim 5, wherein the clock skew control logic element generates a rising edge in the second clock signal between rising and declining edges of the first clock signal in a write-read mode of the memory components.

7. The memory device of claim 5, wherein the clock skew control logic element generates a rising edge of the second clock signal after rising and declining edges of the first clock signal in a write-write mode.

8. The memory device of claim 1, wherein the memory components include at least one of: read-write control logic, an address register, a decoder, and a memory array.

9. A method for generating clock signals in a memory chip:
   providing memory components in the memory chip, wherein the memory components support read and write operations of the memory device, and the operations can include one of read-read, read-write and write-write modes of operation;
   providing a clock skew generator in the memory chip;
   generating at least two stable and balanced clock channels associated with at least two clock signals, and producing on the channels signals controlling timing of the read and write operations, wherein the timing is varied according to different modes, wherein the read and write operations occur substantially simultaneously;
   sending the at least two clock signals to the memory components; and
   delaying and/or dummy loading; the at least two clock signals.

10. The method of claim 9, further comprising sending one of delayed signals and dummy loaded signals to the memory components during controlling the timing of the read and write operations.

11. The method of claim 9, further comprising generating a first clock signal and a second clock signal that are substantially coincident in a read-read mode.

12. The method of claim 9, further comprising generating a rising edge of a second clock signal between rising and declining edges of a first clock signal in a write-read mode.

13. The method of claim 9, further comprising generating a rising edge of a second clock signal after rising and declining edges of a first clock signal in a write-write mode.

14. A memory circuit comprising:
    a housing defining a package for the memory device;
    memory components in the housing supporting read and write operations of the memory device, wherein plural operations can occur substantially coincidentally in different combinations defining different modes of operation of the memory device; and
    a clock skew generator that sends a first clock signal and a second clock signal to the memory components, wherein the clock skew generator generates the first clock signal and the second clock signal that are substantially coincident in at least one mode and are skewed in at least one other mode, wherein the clock skew generator includes combination logic that delays or dummy loads the first clock signal and the second clock signal.

15. The memory circuit of claim 14, wherein the combination logic sends the delayed signals or dummy loaded signals to the memory components.

16. The memory circuit of claim 14, wherein the combination logic generates substantially coincidental clock edges in a read-read mode, and a rising edge of the second clock signal between rising and declining edges of the first clock signal in a write-read mode.

17. The memory circuit of claim 14, wherein the combination logic generates substantially coincidental clock edges in a read-read mode, and a rising edge of the second clock signal after rising and declining edges of the first clock signal in a write-write mode.

* * * * *